(12) United States Patent
Zhong et al.

(10) Patent No.: US 7,508,700 B2
(45) Date of Patent: Mar. 24, 2009

(54) METHOD OF MAGNETIC TUNNELING JUNCTION PATTERN LAYOUT FOR MAGNETIC RANDOM ACCESS MEMORY

(75) Inventors: Tom Zhong, Cupertino, CA (US); Terry Kin Ting Ko, Millbrae, CA (US); Chyu-Jiuh Torng, Pleasanton, CA (US); Wai-Ming Kan, San Ramon, CA (US); Adam Zhong, Milpitas, CA (US)

(73) Assignee: Magic Technologies, Inc., Milpitas, CA (US)

( * ) Notice: Subject to any disclaimer, the term of this patent is extended or adjusted under 35 U.S.C. 154(b) by 197 days.

(21) Appl. No.: 11/724,435

(22) Filed: Mar. 15, 2007

(65) Prior Publication Data
US 2008/0225576 A1 Sep. 18, 2008

(51) Int. Cl.
*G11C 11/00* (2006.01)
(52) U.S. Cl. .............................. 365/158; 257/421; 438/3; 977/935
(58) Field of Classification Search .................. 365/148, 365/158, 171, 173; 257/421; 438/3; 977/933–935
See application file for complete search history.

(56) References Cited
U.S. PATENT DOCUMENTS
6,916,677 B2   7/2005   Nakajima et al.

| 2002/0061608 | A1* | 5/2002 | Kuroda et al. | 438/129 |
| 2002/0145902 | A1* | 10/2002 | Kunikiyo et al. | 365/97 |
| 2003/0223283 | A1 | 12/2003 | Kunikiyo | |
| 2003/0235070 | A1 | 12/2003 | Tsukasa | |
| 2004/0056289 | A1 | 3/2004 | Ooishi | |
| 2005/0044522 | A1* | 2/2005 | Maeda | 716/18 |

* cited by examiner

*Primary Examiner*—Richard Elms
*Assistant Examiner*—Harry W Byrne
(74) *Attorney, Agent, or Firm*—Saile Ackerman LLC; Stephen B. Ackerman (57) ABSTRACT

An MTJ pattern layout for a memory device is disclosed that includes two CMP assist features outside active MTJ device blocks. A first plurality of dummy MTJ devices is located in two dummy bands formed around an active MTJ device block. The inner dummy band is separated from the outer dummy band by the MTJ ILD layer and has a MTJ device density essentially the same as the MTJ device block. The outer dummy band has a MTJ device density at least 10% greater than the inner dummy band. The inner dummy band serves to minimize CMP edge effect in the MTJ device block while the outer dummy band improves planarization. A second plurality of dummy MTJ devices is employed in contact pads outside the outer dummy band and is formed between a WL ILD layer and a BIT ILD layer thereby minimizing delamination of the MTJ ILD layer.

20 Claims, 5 Drawing Sheets

METHOD OF MAGNETIC TUNNELING JUNCTION PATTERN LAYOUT FOR MAGNETIC RANDOM ACCESS MEMORY

FIELD OF THE INVENTION

The invention relates to an improved magnetic tunneling junction (MTJ) pattern layout in a MRAM array and a method of forming the same that achieves superior chemical mechanical polishing (CMP) planarization and minimizes rework.

BACKGROUND OF THE INVENTION

Magnetic random access memory (MRAM) that incorporates a magnetic tunnel junction (MTJ) as a memory storage device is a strong candidate to provide a high density, fast (1-30 ns read/write speed), low power, and non-volatile solution for future memory applications. The architecture for MRAM devices is composed of an array of memory cells generally arranged in rows and columns. Each memory cell is comprised of a memory element (MTJ) that is in electrical communication with a transistor through an interconnect stack. The memory elements are programmed by a magnetic field created from pulse current carrying conductors such as copper lines. Typically, two arrays of current carrying conductors that may be called "word lines" and "bit lines" are arranged in a cross point matrix. Normally, the word lines are formed under the MTJs and are isolated from the memory elements by a one or more layers such as an etch stop layer and an interdielectric (ILD) layer. The bit lines contact the top portion of the MTJs and are electrically connected to a conductive cap layer. Additionally, there is a bottom electrode (BE) that contacts the bottom of each MTJ and electrically connects the MTJ with an underlying transistor.

The MTJ consists of a stack of layers with a configuration in which two ferromagnetic layers are separated by a thin insulating layer such as $AlO_x$ that is called a tunnel barrier layer. One of the ferromagnetic layers is a pinned layer in which the magnetization (magnetic moment) direction is more or less uniform along a preset direction and is fixed by exchange coupling with an adjacent anti-ferromagnetic (AFM) pinning layer. The second ferromagnetic layer is a free layer in which the magnetization direction can be changed by external magnetic fields. The magnetization direction of the free layer may change in response to external magnetic fields which can be generated by passing currents through a bit line and word line as in a write operation. When the magnetization direction of the free layer is parallel to that of the pinned layer, there is a lower resistance for tunneling current across the insulating layer (tunnel barrier) than when the magnetization directions of the free and pinned layers are anti-parallel. The MTJ stores digital information ("0" and "1") as a result of having one of two different magnetic states.

In a read operation, the information is read by sensing the magnetic state (resistance level) of the MTJ through a sensing current flowing through the MTJ, typically in a current perpendicular to plane (CPP) configuration. During a write operation, the information is written to the MTJ by changing the magnetic state to an appropriate one by generating external magnetic fields as a result of applying bit line and word line currents. Cells which are selectively written to are subject to magnetic fields from both a bit line and word line while adjacent cells (half-selected cells) are only exposed to a bit line or a word line field.

As the MTJ size from a top-down view shrinks relative to the easy axis and hard axis directions (x,y plane), and from a cross-sectional perspective is reduced in thickness (perpendicular to the x,y plane) in order to satisfy higher performance MRAM requirements, the interconnects within the MRAM structure also decrease in size to conform to electrical requirements and space restrictions for high density designs. There is also a greater demand on reliability of the MRAM device since reduced MTJ sizes usually lead to a greater chance of device failure at contact points between adjacent metal layers and tend to cause delamination of the one or more interlayer dielectric (ILD) layers that separate the bit line and word line during CMP processing.

In order to maximize word line and bit line writing efficiency in an MRAM device, one needs to minimize both the distance from the bit line (BIT) to the MTJ free layer and the distance from the word line (WL) to the MTJ free layer. The distance between the WL and MTJ free layer is normally reduced by a cut back in thickness of one or more of the WL, WL ILD, and BE layers. In order to shorten the distance between the BIT and MTJ free layer, one needs to reduce the MTJ capping layer thickness and/or the insulator thickness (if any) between the BIT and MTJ capping layer.

The method of shrinking the distance between the BIT and MTJ free layer depends on the approach taken to create the connection between the BIT and MTJ. In one approach, the BIT directly connects to the MTJ capping layer. This method involves forming a thick hard mask layer normally made of Ta on the MTJ stack of layers. Once the MTJ stack is patterned and etched to form an array of MTJ elements, a layer of insulator material (MTJ ILD) is deposited over the MTJ array. Then CMP is used to remove the MTJ ILD layer until it becomes coplanar with the hard mask surface. Subsequently, the BIT layer is deposited and patterned on the MTJ ILD layer and over the MTJ array. A second approach consists of connecting the BIT to the MTJ through a via. Insulator materials are first deposited after MTJ pattern and etch. Then CMP is employed to planarize the insulator layer but stops before reaching the MTJ hard mask surface. Next, a contact hole layer is photo-patterned and etched to the top surface of the MTJ element. The BIT and via between the BIT and MTJ may be deposited during the same dual damascene process. The second approach is not only costly but has difficulty in controlling distance between the BIT and MTJ from wafer to wafer. The second method is also faced with a serious overlay requirement between the via layer and MTJ array as MTJ size scales down. The first method is more efficient but is limited by CMP dishing and protrusion control capability unless a very thick capping layer about 1000 Angstroms thick or more is used. However, the thick hard mask layer causes a loss in writing efficiency and results in problems for MTJ etch process control. Therefore, a change in mask design for the MTJ layout in an MRAM device is needed to enable the CMP process following MTJ ILD deposition to achieve improved planarization and prevent delamination of dielectric layers above the WL.

A routine search of the prior art revealed the following references. In U.S. Pat. No. 6,928,015, a magnetic memory device is described that has dummy cells in a peripheral portion of the MTJ cell array to achieve uniform pitch throughout the area in center and non-center portions. U.S. Pat. No. 6,916,677 discloses a magnetic memory device having dummy elements in a peripheral circuit portion wherein the sum total of occupying areas of the dummy elements is 5% to 80% of the peripheral circuit portion in order to improve CMP uniformity. U.S. Patent Application 2004/0056289 shows dummy cells that are arranged for uniform CMP speed. U.S. Patent Application 2003/0223283 teaches dummy cells, word lines, and bit lines for uniform trench etching.

SUMMARY OF THE INVENTION

One objective of the present invention is to provide a MTJ pattern layout in a MRAM device that minimizes delamination of dielectric layers between the word line and bit line during CMP processing of the MTJ ILD layer.

A second objective of the present invention is to provide a MTJ pattern layout according to the first objective that also improves planarization of the MTJ ILD layer.

According to the present invention, these objectives are achieved by providing a substructure for a MRAM array that includes metal layers, insulating layers, and transistors arranged in a conventional configuration on a semiconductor substrate. In the exemplary embodiment, the substructure includes a word line pad (WLP), word line contact (WLC), and a word line (WL) which may be comprised of Cu and are coplanar with a word line ILD layer. A first etch stop layer such as SiNx or the like is deposited on the word line ILD layer, WLP, WLC, and word line. The first etch stop layer may be patterned and etched to form openings over certain portions of the underlying layers. A bottom electrode (BE) layer, a MTJ stack of layers, and a hard mask are sequentially deposited on the first etch stop layer. In one embodiment, a second patterning and etch sequence is employed to remove the hard mask, MTJ stack, and BE over certain regions of the first etch stop layer and thereby form an array of MTJ elements in a MTJ pattern layout. These MTJ elements include both dummy and active MTJ devices.

One key feature of the present invention is that the MTJ pattern layout includes a plurality of dummy MTJ devices comprised of a lower BE layer, MTJ element, and overlying hard mask which are retained in certain contact pad regions that are normally devoid of dummy MTJ devices in prior art. The resulting plurality of dummy MTJ devices in contact pad regions is fabricated on areas of the first etch stop layer that are not located directly above WL metals including WL, WLC, and WLP. Furthermore, a plurality of contact pads comprised of the dummy MTJ devices is positioned outside each of the active MTJ device blocks within the plurality of chips on a substrate. This design essentially eliminates contact pad peeling problems where one or more dielectric layers delaminate during CMP but avoids a contact pad resistance increase issue because the BE/MTJ/hard mask stack does not directly contact any WL metal.

The new MTJ pattern layout further includes a second key feature which is a dummy band pattern formed around each of the active MTJ device blocks. Contact pads having dummy MTJ devices mentioned above are arranged around each dummy band pattern. Unlike a conventional layout that has a single dummy band formed around a MTJ device block that may be in the shape of a rectangle, there are two dummy bands in the present invention. The two dummy bands are comprised of a plurality of dummy MTJ devices having a BE/MTJ stack/hard mask configuration and adjacent dummy MTJ devices in each dummy band are separated by the MTJ ILD layer. Moreover, the dummy bands preferably have different densities of dummy MTJ devices wherein the outer band has at least a 10% higher density than the inner band. In one aspect, an inner dummy band is separated from an outer dummy band by a spacer that is comprised of the MTJ ILD layer.

The second patterning and etch sequence described previously simultaneously forms the dummy MTJ devices in the contact pad region and in the two dummy bands as well as the active MTJ devices according to a process flow of the present invention. Thereafter, an MTJ ILD layer is deposited on the dummy MTJ arrays and active MTJ arrays and is followed by a CMP process that stops on the hard mask layer. Next, a second etch stop layer and a bit line ILD layer are sequentially deposited on the MTJ ILD and hard mask. A third patterning and etch sequence is employed to form trenches in the BIT ILD which stop on the second etch stop layer. Then another patterning and etch process is used to form vias in the aforementioned trenches that extend through the underlying MTJ ILD and first etch stop to uncover portions of the WLC layer. The trenches and vias are filled with a metal such as Cu to form interconnects between the bit line material in the trenches and WLC layer. The final step in the process flow involves a third CMP step to planarize the bit line material and the BIT ILD layer. As a result of the improved MTJ pattern layout, delamination of the MTJ ILD is minimized during the CMP steps and improved planarization of the MTJ ILD is achieved to reduce dishing and protrusions of the MTJ stack/hard mask above the MTJ ILD.

DETAILED DESCRIPTION OF THE INVENTION

The present invention is a novel MTJ pattern layout that minimizes delamination of dielectric layers between a word line (WL) layer and a bit line (BIT) layer in a magnetic memory device, and minimizes dishing and protrusions following a CMP process that planarizes the BE/MTJ/hard mask stack and adjacent MTJ ILD layer. Although the exemplary embodiment depicts a MRAM device, the present invention may also apply to other magnetic memory devices known in the art that require a CMP process to stop on an array of MTJ devices. Drawings are provided by way of example and are not intended to limit the scope of the invention. For example, the number and position of MTJ devices or contact pads depicted in a particular design may not represent an actual layout used in manufacturing but are intended to show one possible layout that could be employed. The MTJ devices may have a top spin valve, bottom spin valve, or multi-layer spin valve configuration as understood by those skilled in the art.

Figure 1A:
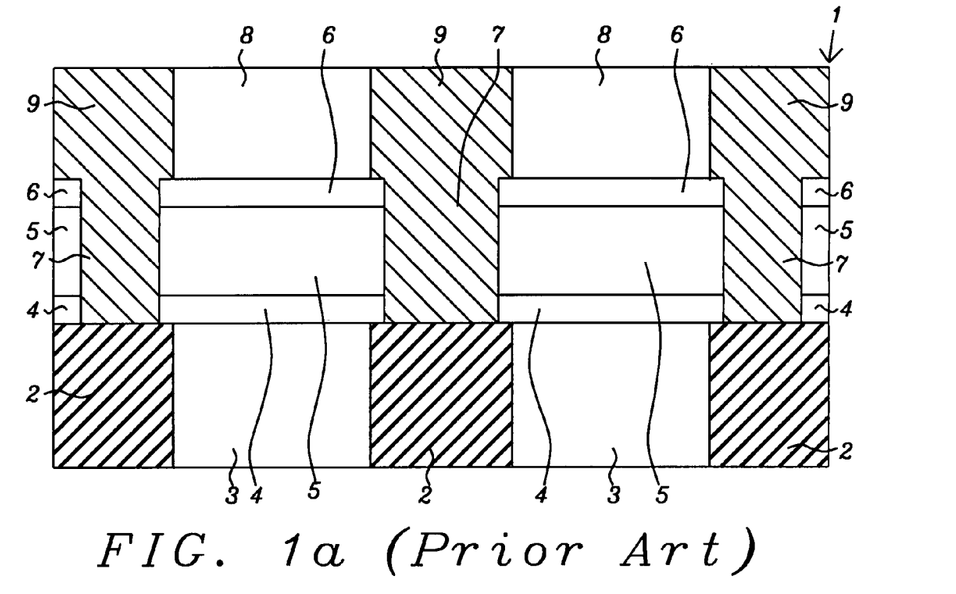
FIG. 1a and FIG. 1b are a cross-sectional view and top-down view, respectively, of a prior art MRAM structure that shows a word line contact and WL ILD, intermediate dielectric layers, and an upper bit line and BIT ILD layer.
Figure 1B:
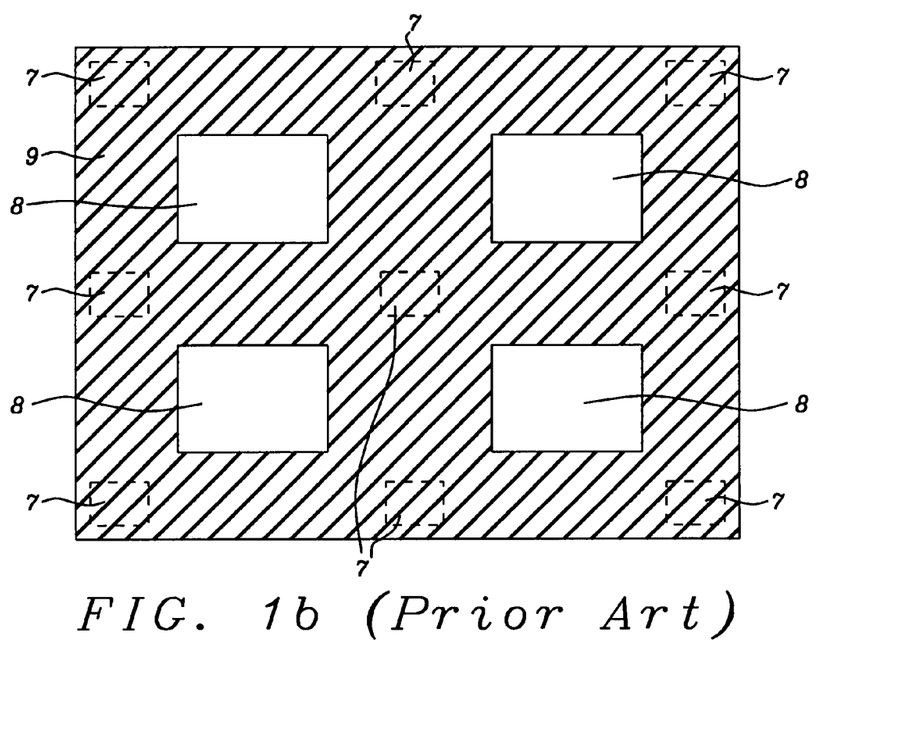

The inventors have previously practiced a fabrication method that generates a MRAM structure comprised of a plurality of contact pads of which one is depicted in FIGS. 1a-1b. This contact pad is typically positioned outside of an active MTJ device block and will be described first in order to point out features that lead to reliability issues. Then an improved MTJ pattern layout and associated fabrication sequence will be described in a later section.

Referring to FIG. 1a, a contact pad structure is shown that is fabricated on a substructure (not shown) comprised of metal layers, insulating layers, transistors, and other devices as appreciated by those skilled in the art. A contact pad as described herein is comprised of a word line layer, a bit line (BIT) material layer, and all layers therebetween. Typically, a plurality of contact pads is formed in a MRAM structure to enable a probe of device current in regions outside active MTJ blocks. There is a word line interlayer dielectric layer (WL ILD) 3 formed on the substructure. The WL ILD 3 may be made of fluorosilicate glass (FSG), silicon oxide, or a low k dielectric material. A word line metal layer comprised of a plurality of word line contacts WLC 2 also known as word line contact pads is formed in the WL ILD 3 and is coplanar with the adjacent WL ILD. Note that word lines and word line pads (WLP) are also formed in the word line metal layer but are not shown in the drawing since they are located in the active MTJ device blocks and not in the contact pad 1. A conventional patterning, etching, metal deposition, and planarization sequence is employed to form the WLC 2 in the WL ILD 3. Typically, the metal in the word line layer is Cu and a first CMP process is needed to make the WLC 2 coplanar with the WL ILD 3.

Above the WLC 2 and WL ILD 3 is a first etch stop layer 4 that is made of silicon nitride ($SiN_x$) or the like. The first etch stop layer 4 may be deposited by a chemical vapor deposition (CVD) or a physical vapor deposition (PVD), for example. A standard photoresist patterning and etch sequence is used to form openings (not shown) in certain regions of the first etch stop layer 4. Thereafter, a bottom electrode (BE) layer, a MTJ stack of layers, and a hard mask (not shown) are sequentially formed on the first etch stop layer 4. Once the BE/MTJ/hard mask layers are patterned, a MTJ ILD layer 5 is formed on the first etch stop layer 4 and over the BE/MTJ/hard mask regions. The MTJ ILD 5 is then planarized with a second CMP process. Unfortunately, the second CMP process tends to cause delamination of the MTJ ILD layer 5 and/or etch stop layer 4 when the etch stop layer becomes thinner thereby causing yield loss in the resulting MRAM devices. Subsequent processing involves formation of a second etch stop layer 6 on the MTJ ILD 5, and a bit line ILD (BIT ILD) 8 on the second etch stop layer. Typically, a dual damascene process follows and is used to fabricate openings above portions of the WLC 2 that are filled to form vias 7 and bit line (BIT) contact pads 9. A third CMP process is used to planarize the BIT ILD 8 and adjacent BIT metal layer including BIT contact pads 9. Note that there are no BE/MTJ layers between the WLC 2 and BIT contact pads 9 to avoid a contact pad resistance increase due to current passing through the tunnel barrier (insulator) in the MTJ stack.

Referring to FIG. 1b, a top-down view of contact pad 1 in FIG. 1a shows the location of vias 7 relative to the BIT contact pad 9 and openings therein which are BIT ILD 8.

Figure 2:
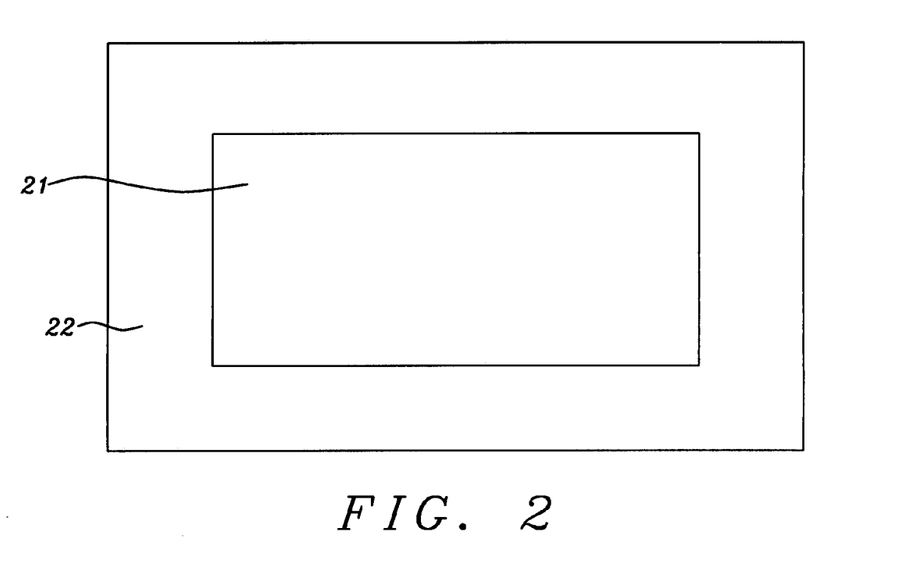
FIG. 2 is a top-down view of a prior art design for a MTJ device pattern that includes a dummy band formed around an active MTJ device block.

Referring to FIG. 2, a top-down view of a prior art MTJ pattern layout illustrates how a band of dummy MTJ devices 22 surrounds an active MTJ device block 21 containing a plurality of MTJ devices in order to assist the CMP planarization of the MTJ ILD 5 and reduce delamination and dishing of the dielectric layer. However, this design does not improve CMP performance to the extent necessary to satisfy advanced MRAM performance requirements. For example, there is still a significant amount of rework involving about 10% of substrates to correct delamination and planarization issues.

Figure 3:
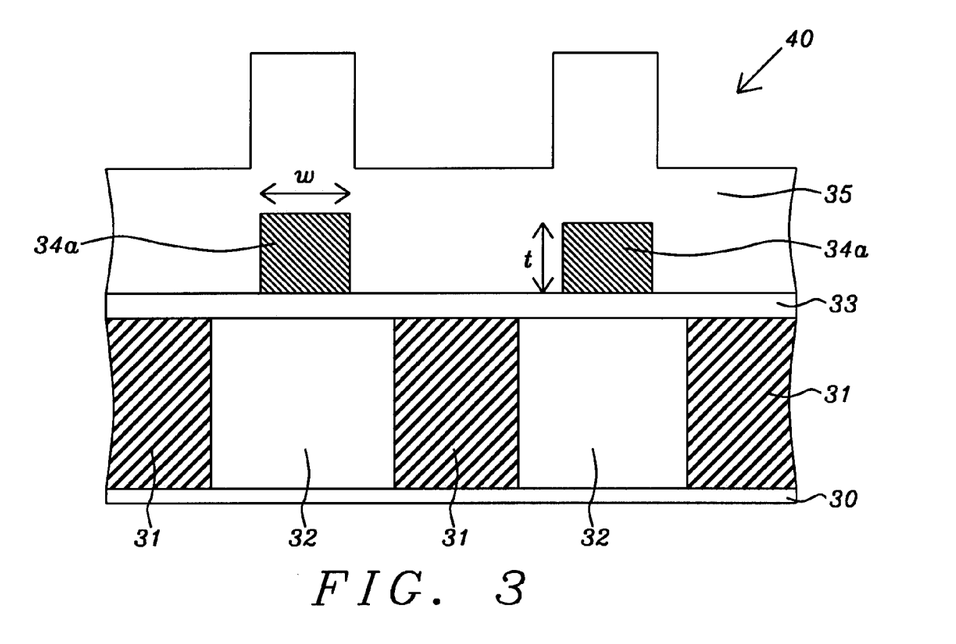
FIG. 3 is a cross-sectional view of a contact pad comprised of dummy MTJ devices formed within a MTJ ILD layer and that do not contact any word line metal according to an embodiment the present invention.

A MTJ pattern layout according to the present invention and a method for forming the same will now be described. Referring to FIG. 3, a plurality of WLC 31 are formed in a WL ILD layer 32 in a partially formed contact pad 40 above a substructure 30 similar to the WLC 2 and WL ILD 3 configuration mentioned previously with respect to FIG. 1a. A dielectric layer that may be referred to as a first etch stop layer 33 having a thickness of about 100 to 2000 Angstroms is deposited on the WLC 31 layer and WL ILD layer 32 and openings (not shown) may be etched therein.

A key feature of the present invention is the formation of a plurality of dummy MTJ devices 34a is on the first etch stop layer 33 above certain regions of the WL ILD layer 32 such that there is no WL metal layer including WLC 31 directly below the dummy MTJ devices 34a. In one embodiment, a dummy MTJ device 34a is comprised of a BE/MTJ/HM stack that has a thickness "t" in the range of 1000 to 2000 Angstroms and a width "w" between about 10000 and 50000 Angstroms. From a top-down perspective (not shown), the dummy MTJ devices 34a may have a square, elliptical, or circular shape, for example. It should be understood that the dummy MTJ devices 34a are formed simultaneously with the active MTJ devices 34b (FIG. 8) in the active MTJ device blocks by a conventional deposition, patterning, and etch sequence. For example, a sputter deposition system such as an Anelva 7100 system may be used to sequentially deposit the BE, MTJ stack, and hard mask layers that are subsequently used to form dummy MTJ devices 34a as well as active MTJ devices 34b. Unlike the active MTJ devices 34b, the dummy MTJ devices 34a cannot be used for data storage since there is no overlying bit line (BIT) or underlying WL that are necessary to switch the free layer memory state in the MTJ component of the dummy MTJ devices 34a.

The present invention encompasses a wide variety of configurations for the MTJ pattern layout that includes MTJ devices 34a, 34b as appreciated by those skilled in the art. Moreover, a dummy MTJ device 34a and active MTJ device 34b are not limited to certain materials for a particular layer. In one embodiment, the hard mask is a Ta layer having a thickness of about 200 to 1500 Angstroms. The MTJ pattern layout of the present invention is also comprised of a two bands of dummy MTJ devices surrounding each active MTJ device block on a chip. The dummy MTJ devices in the two bands have the same composition as the dummy devices 34a in the contact pads and will be described in a later section.

Returning to FIG. 3, a MTJ ILD layer 35 that may be comprised of the same dielectric material as in the WL ILD layer 3 is deposited by a PVD or CVD method or the like on the first etch stop layer 33 and over the dummy MTJ devices 34a (and active MTJ devices 34b and the two bands of dummy MTJ devices). The MTJ ILD layer 35 has a thickness greater than t and is thicker in regions above the MTJ devices 34a, 34b than above the first etch stop layer 33.

Figure 4:
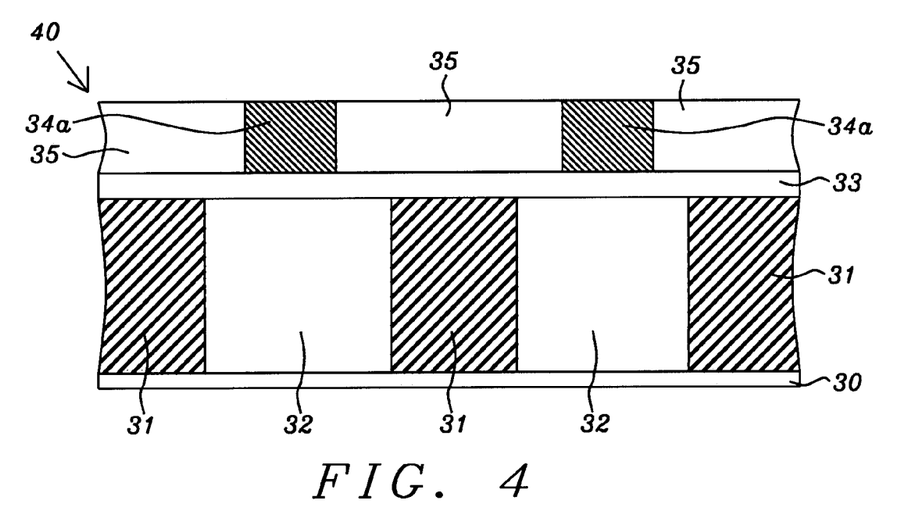
FIG. 4 is a cross-sectional view of the contact pad structure in FIG. 3 after a CMP process is used to planarize the MTJ ILD layer.

Referring to FIG. 4, a second CMP process is performed to planarize the MTJ ILD layer 35 so that the dielectric layer becomes coplanar with the dummy MTJ devices 34a. Note that a top portion of the hard mask layer (not shown) in the dummy MTJ devices 34a may be partially removed during the CMP process. It should be understood that the active MTJ devices 34b and the two bands of dummy MTJ devices around the active MTJ device area are also coplanar with the MTJ ILD layer 35 following the planarization process. The inventors have discovered a significant advantage in employing the dummy MTJ devices 34a and two bands of dummy MTJ devices according to the present invention in that there is a substantial reduction in delamination of the MTJ ILD layer 35 during the second CMP process. Furthermore, the MTJ pattern layout of the present invention results in a lower tendency for dishing in the MTJ ILD layer 35 and for protrusions of the MTJ devices 34a, 34b above the adjacent MTJ ILD layer 35. Thus, the MRAM device yield is increased and MRAM performance is improved because the thickness of the hard mask layer is more uniform than in prior art and thereby the switching field is more controllable since the distance between the MTJ free layer and overlying BIT is kept within a tighter tolerance than previously achieved.

Figure 5:
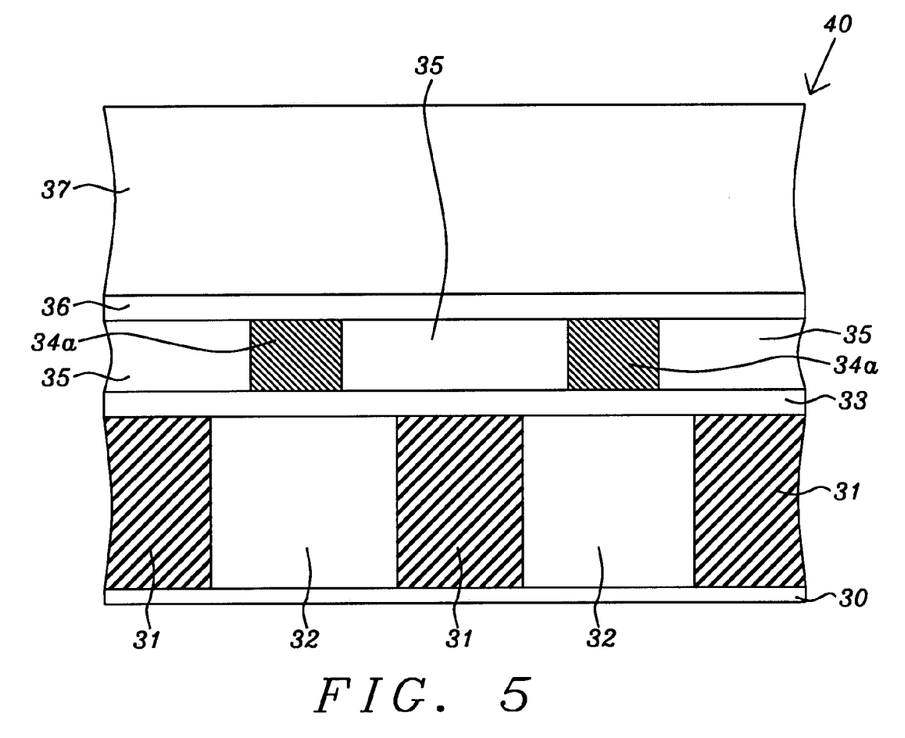
FIG. 5 is a cross-sectional view of the contact pad structure in FIG. 4 after a second etch stop layer and a BIT ILD layer are sequentially formed on the MTJ devices and MTJ ILD layer.

Referring to FIG. 5, the next step in the fabrication sequence of a contact pad 40 in a MRAM structure according to the exemplary embodiment of the present invention is the deposition of a second dielectric layer that may be referred to as a second etch stop layer 36 on the MTJ ILD layer 35, dummy MTJ devices 34a, and on the two bands of dummy MTJ devices and active MTJ devices 34b (not shown). The second etch stop layer 36 is formed by a CVD or PVD method, for example, and may be comprised of SiNx or the like. The thickness of the second etch stop layer 36 may be in the range of 100 to 500 Angstroms. Thereafter, a bit line ILD layer hereafter referred to as BIT ILD layer 37 having a thickness of about 1000 to 10000 Angstroms is deposited on the second etch stop layer 36. The BIT ILD layer 37 may have the same composition as the dielectric material in the MTJ ILD layer 35 and in the WL ILD layer 32.

Figure 6A:
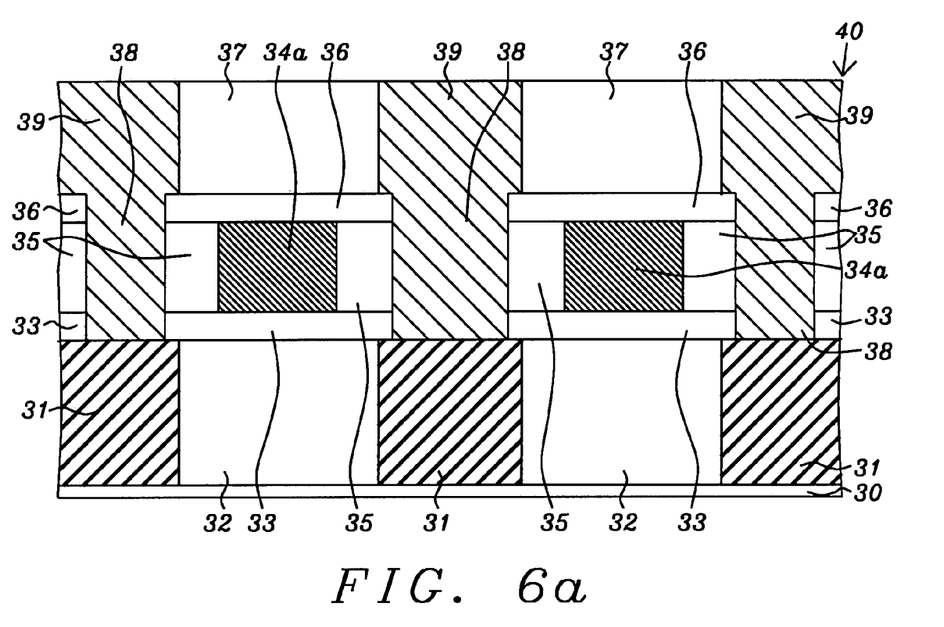
FIG. 6a is a cross-sectional view of the contact pad structure in FIG. 5 following a dual damascene process that forms vias between a WL contact and bit line material and then a CMP process to planarize the bit line material and BIT ILD.

Referring to FIG. 6a, a dual damascene process is performed in which a first patterning and etch sequence is used to form trenches in the BIT ILD layer 37 that uncover portions of the second etch stop layer 36. The patterning step typically involves coating a photoresist layer on the BIT ILD layer 37 and imaging by a conventional method to form trench openings in the photoresist layer. Next, the trench openings are transferred through the BIT ILD layer 37 by a reactive ion etch (RIE) method, for example, and stop on the second etch stop layer 36. Then the photoresist layer is removed by a known method. A second photoresist patterning and etch sequence is followed to form vias also known as contact holes below the trench openings and through the second etch stop layer 36, MTJ ILD layer 35, and first etch stop layer 32 thereby uncovering portions of the WLC 31 below the trench openings. Once the second photoresist layer is removed, the vias and trenches are filled with metal such as Cu to form vias 38 and BIT contact pads 39 in the trenches. In other words, the vias 38 are interconnects between the BIT contact pads 39 and the WL metal level including WLC 31. Note that the BIT contact pads 39 are not electrically connected to bit lines formed during the same metal deposition process in the active MTJ device block regions (not shown). Preferably, a third CMP process is performed to planarize the BIT contact pads 39 so that the BIT ILD layer 37 is now coplanar with the BIT contact pads (and bit lines).

With regard to the dummy MTJ devices 34a in contact pad 40, note that the plurality of dummy MTJ devices is essentially coplanar with the MTJ ILD layer 35. Furthermore, the dummy MTJ devices 34a do not contact any WLD contacts 31 and are positioned between the WLD ILD layer 32 and BIT ILD layer 37. In the exemplary embodiment, the dummy MTJ devices are sandwiched between the first etch stop layer 33 and the second etch stop layer 36 to give a stack represented by BIT ILD/second etch stop/dummy MTJ/first etch stop/ WLD ILD in top to bottom order. The contact pad 40 is now considered complete since the word line metal layer including WLC 31, bit line metal layer including BIT contact pad 39, and all layers therebetween are complete.

Figure 6B:
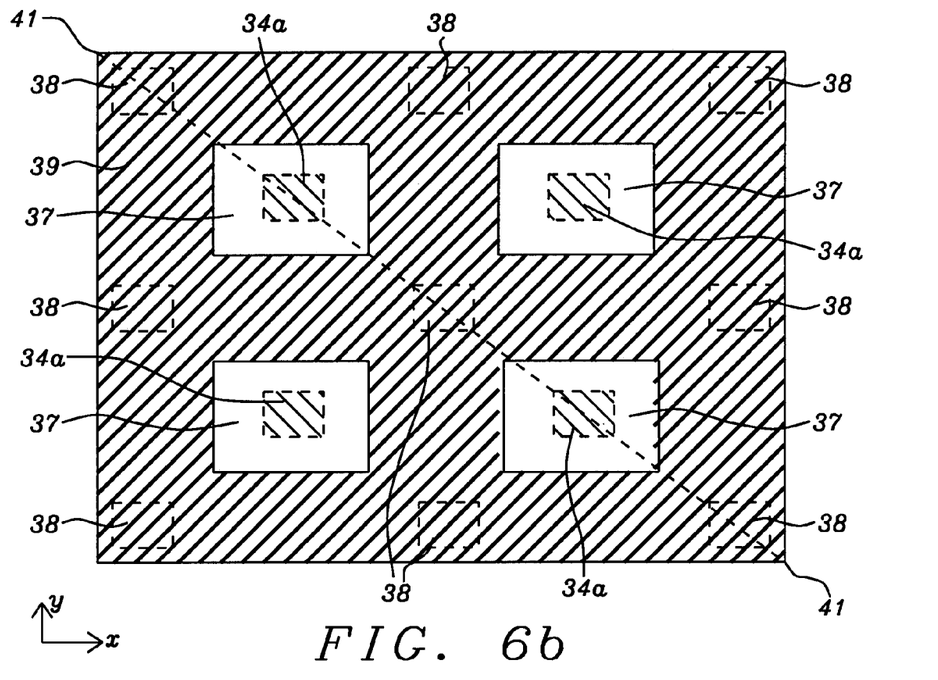
FIG. 6b is a top-down view of the contact pad structure in FIG. 6a that shows placement of the dummy MTJ devices in regions between the WL ILD and BIT ILD to minimize delamination of dielectric layers between the BIT and WL layers.

Referring to FIG. 6b, a top-down perspective of contact pad 40 in FIG. 6a is shown. Note that the cross-sectional view in FIG. 6a is obtained from a plane 41-41 that extends diagonally across FIG. 6b. In one embodiment, the dummy MTJ devices 34a are aligned in rows along the x-axis direction and columns along the y-axis direction and are covered by the BIT ILD layer 37. There may be a plurality of vias 38 arranged in rows along an x-axis direction and in columns along the y-axis direction below BIT contact pad 39. BIT contact pad 39 is comprised of parallel BIT metal lines aligned in an x-axis direction and a second set of parallel BIT metal lines aligned in a y-axis direction. The present invention is not limited by the shape and size of the BIT contact pad 39 since shapes other than squares (i.e. rectangles) may be employed and the size of the BIT via 38 array and dummy MTJ device 34a array may be larger than 3×3 (9 vias) and 2×2 or 4 dummy MTJ devices, respectively. In one aspect, there may be a via 38 offset from each of the four corners of a dummy MTJ device 34a.

Figure 7:
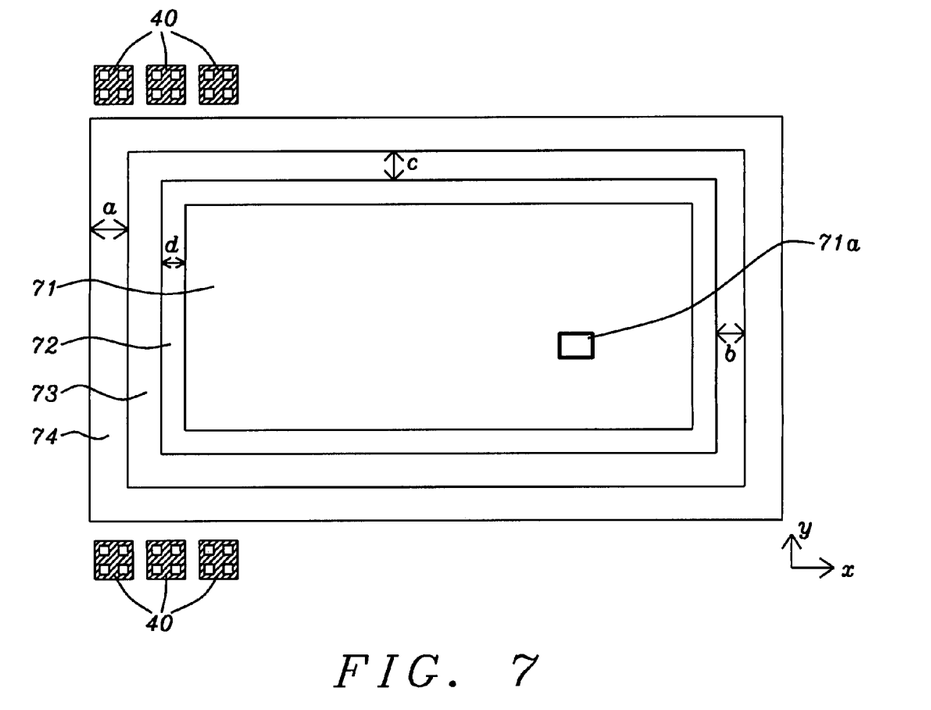
FIG. 7 is a top-down view that illustrates the location of double dummy bands comprised of dummy MTJ devices around an active MTJ device block, a dielectric spacer between the two dummy bands, and a plurality of contact pads having dummy MTJ devices outside the dummy bands.
Figure 8:
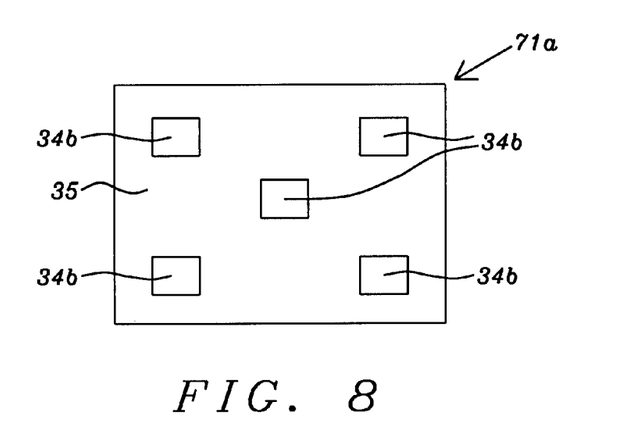
FIG. 8 shows an enlarged portion of an active MTJ device block comprised of a plurality of active MTJ devices that are separated from each other by a MTJ ILD layer.

Referring to FIG. 7, a new design for a MTJ pattern layout according to the present invention is depicted from a top-down view. In the exemplary embodiment, an active MTJ device block 71 is comprised of a plurality of active MTJ devices 34b and adjacent MTJ devices are separated by an MTJ ILD layer 35 as shown by an enlargement of region 71a (FIG. 8). Note that the crosspoint pattern of word lines and bit lines formed above and below the active MTJ devices 34b is not shown in order to simplify the drawing. Furthermore, the present invention also encompasses other active MTJ device arrays other than the pattern shown in FIG. 8 as appreciated by those skilled in the art. It should be understood that there are a plurality of active MTJ device blocks within each chip on a substrate.

Returning to FIG. 7, an important feature of the present invention is a CMP assist structure comprised of two bands of dummy MTJ devices 72, 74. Unlike the conventional layout that has a single dummy band around an active MTJ device block, this approach comprises two dummy bands 72, 74 made of a plurality of dummy MTJ devices 34a (not shown) that are separated by a spacer layer 73 which represents MTJ ILD layer 35. In the exemplary embodiment, the active MTJ device block 71 and dummy bands 72, 74 are all rectangular in shape. However, the dummy bands are not limited to a rectangular shape and may have other functional shapes as appreciated by those skilled in the art. The inner dummy band 72 preferably has a similar MTJ device pattern density (defined as the number of MTJ devices/cm$^2$) as active MTJ device block 71.

In the exemplary embodiment, the inner dummy band has a width d in the x-axis direction between the active MTJ device block 71 and spacer layer 73 of about 10 to 50 microns and an equal width in the y-axis direction between the active MTJ device block and spacer layer 73. However, the width of the inner dummy band 72 does not necessarily have to be equal along all four sides of the active MTJ device block 71. The main purpose of the inner dummy band 72 is to prevent any CMP edge effect. In other words, the inner dummy band 72 prevents the hard mask layer in the active MTJ devices 34b in regions near the inner dummy band from being polished at a faster or slower rate compared to the active MTJ devices nearer the center of the active MTJ device block 71 during the CMP process that planarizes MTJ ILD layer 35. As a result, a better uniformity in thickness t of active MTJ devices 34b is achieved within the active MTJ device blocks 71.

The outer dummy band 74 preferably has at least a 10% higher pattern density of dummy MTJ devices 34a than the inner dummy band 72. The primary function of the outer dummy band 74 is to provide the necessary physical support during polishing by the CMP pads to achieve improved planarization and minimized dishing of the MTJ ILD layer 35 within the active MTJ device block 71, and also minimize protrusion of the hard mask layer above the MTJ ILD layer 35. The outer dummy band 74 has a width a of about 10 to 50 microns. Like the inner dummy band 72, the width a of the outer dummy band is not necessarily the same at all locations around the active device block 71 and may vary in certain regions in order to optimize the results of the CMP process. The spacer layer 73 between the dummy bands 72, 74 is occupied by the MTJ ILD layer 35 that has no MTJ devices 34a, 34b, and preferably the distance c between the two dummy bands is in the range of 10 to 50 microns in order to maximize polishing efficiency. Note that the distance c does not necessarily have to be equivalent on all four sides of inner dummy band 72. If the distance c is too small, then the polish rate decreases and process time (and cost) increases. When the distance c is too large, the effect of the outer dummy band 74 is reduced and planarization and dishing become more difficult to control.

In one embodiment, the dual dummy band configuration is formed around each active device block 71 in the MRAM structure. In one aspect, the area of the inner band 72 may be equal to or less than the area of outer band 74. Optionally, the area of the inner band 72 may be greater than that of the outer band 74.

In the exemplary embodiment, there is a plurality of contact pads 40 arranged around the outer dummy band 74. Although only six contact pads 40 are depicted in FIG. 7, there may be 36 or more positioned a distance e of about 10 to 50 microns from the outer dummy band 74, and preferably greater than about 20 microns. The number of contact pads 40 employed varies and is a function of the chip design.

By implementing both of the key features of the present invention, the inventors have achieved a rework of less than 1% compared to a rework of about 10% when practicing a prior art method of a single dummy band and no dummy MTJ devices in the contact pads 40. Thus, the dummy bands may be considered a first CMP assist feature and the dummy MTJ devices in the contact pads 40 may be considered a plurality of second CMP assist features since they provide a substantial improvement over a conventional MTJ pattern layout by enabling a more uniform CMP process that minimizes dielectric layer delamination and especially delamination of MTJ ILD layer 35.

While this invention has been particularly shown and described with reference to, the preferred embodiment thereof, it will be understood by those skilled in the art that various changes in form and details may be made without departing from the spirit and scope of this invention.

We claim:

1. A MTJ pattern layout in a memory device, comprising:
   (a) a plurality of chips formed on a substrate wherein each chip has a plurality of active MTJ device blocks arranged in a certain array;
   (b) a first CMP assist feature formed around each active MTJ block and comprised of two dummy bands made of dummy MTJ devices with an MTJ ILD layer formed between adjacent dummy MTJ devices, and wherein an inner dummy band is separated from an outer dummy band by a dielectric spacer layer having no MTJ devices; and
   (c) an array of second CMP assist features formed outside said outer dummy band wherein a second CMP assist feature is comprised of a plurality of dummy MTJ devices formed within a contact pad and said contact pad is separated from the outer dummy band by a certain distance.

2. The MTJ pattern layout of claim 1 wherein active MTJ devices in the active MTJ device blocks and dummy MTJ devices in the dummy bands and contact pads are comprised of a lower bottom electrode (BE), a middle MTJ stack of layers, and an upper hard mask layer.

3. The MTJ pattern layout of claim 1 wherein the dummy MTJ devices in the inner dummy band have a pattern density essentially the same as the pattern density of active MTJ devices in the active MTJ device block, and the pattern density of the dummy MTJ devices in the outer dummy band is at least 10% greater than the pattern density of dummy MTJ devices in the inner dummy band.

4. The MTJ pattern layout of claim 1 wherein the dielectric spacer layer between the inner dummy band and outer dummy band is a MTJ ILD layer, and the distance between the inner dummy band and outer dummy band is about 10 to 50 microns.

5. The MTJ pattern layout of claim 1 wherein a contact pad is comprised of word line (WL) contacts formed within a WL ILD layer, a plurality of vias overlying the WL contacts and contacting portions thereof, a bit line (BIT) contact pad formed within a BIT ILD layer and over the vias and contacting said vias, and one or more dielectric layers including a MTJ ILD layer between the WL ILD layer and BIT ILD layer.

6. The MTJ pattern layout of claim 5 wherein the plurality of dummy MTJ devices formed within a second CMP assist feature is essentially coplanar with the MTJ ILD layer but does not contact any WL contacts and is positioned in a certain array between the WLD ILD layer and BIT ILD layer.

7. The MTJ pattern layout of claim 1 wherein the inner dummy band has an area equal to or greater than the area of the outer dummy band.

8. The MTJ pattern layout of claim 1 wherein the inner dummy band has an area less than the area of the outer dummy band.

9. The MTJ pattern layout of claim 1 wherein the certain distance between the outer dummy band and a contact pad is about 10 to 50 microns.

10. A method of forming a MTJ pattern layout in a memory device, comprising:
    (a) providing a substrate comprised of a plurality of word line (WL) contacts formed within and coplanar with a WL ILD layer;
    (b) forming a first etch stop layer on said substrate;
    (c) simultaneously forming a plurality of active MTJ devices in an active MTJ device block, a plurality of dummy MTJ devices within two concentric dummy bands formed around said active MTJ device block wherein an inner dummy band is separated from an outer dummy band by a dielectric spacer layer having no MTJ devices, and a plurality of dummy MTJ devices within contact pads formed a certain distance outside said outer dummy band, and wherein all active MTJ devices and dummy MTJ devices are disposed on said first etch stop layer; and (d) forming a MTJ ILD layer on said first etch stop layer that separates adjacent MTJ devices and is essentially coplanar with said active MTJ devices and dummy MTJ devices.

11. The method of claim 10 further comprised of (a) forming a second etch stop layer on the MTJ ILD layer, dummy MTJ devices, and active MTJ devices, and then depositing a bit line (BIT) ILD layer on the second etch stop layer;

(b) forming a plurality of trenches in the BIT ILD layer that stop on the second etch stop layer, and forming a plurality of vias below said trenches that contact portions of said WL contacts; and (c) depositing a metal in said vias and trenches to form BIT contact pads in said trenches, and vias that connect said WL contacts to said BIT contact pads.

12. The method of claim 11 wherein active MTJ devices in the active MTJ device block and dummy MTJ devices in the dummy bands and contact pads are comprised of a lower bottom electrode (BE), a middle MTJ stack of layers, and an upper hard mask layer.

13. The method of claim 10 wherein the dummy MTJ devices in the inner dummy band have a pattern density essentially the same as the pattern density of active MTJ devices in the active MTJ device block, and the pattern density of the dummy MTJ devices in the outer dummy band is at least 10% greater than the pattern density of dummy MTJ devices in the inner dummy band.

14. The method of claim 10 wherein the dielectric spacer layer between the inner dummy band and outer dummy band is a MTJ ILD layer, and the distance between the inner dummy band and outer dummy band is about 10 to 50 microns.

15. The method of claim 11 wherein a contact pad is comprised of word line (WL) contacts formed within said WL ILD layer, said plurality of vias overlying the WL contacts and contacting portions thereof, said BIT contact pad formed within the BIT ILD layer and over the vias and contacting said vias, and one or more dielectric layers including said MTJ ILD layer between the WL ILD layer and BIT ILD layer.

16. The method of claim 11 wherein the plurality of dummy MTJ devices formed within a contact pad is essentially coplanar with the MTJ ILD layer but does not contact any WL contacts and is positioned in a certain array between the WLD ILD layer and BIT ILD layer.

17. The method of claim 10 wherein the inner dummy band has an area equal to or greater than the area of the outer dummy band.

18. The method of claim 10 wherein the inner dummy band has an area less than the area of the outer dummy band.

19. The method of claim 10 wherein the certain distance between the outer dummy band and a contact pad is about 10 to 50 microns.

20. The method of claim 10 wherein the method of forming a MTJ ILD layer that is coplanar with said dummy MTJ devices and active MTJ devices is comprised of a chemical mechanical polish (CMP) step and the size of the dummy bands and distance between the contacts pads and outer dummy band may be adjusted to minimize MTJ ILD layer delamination and optimize planarization of the MTJ ILD layer.

* * * * *

UNITED STATES PATENT AND TRADEMARK OFFICE
CERTIFICATE OF CORRECTION

PATENT NO. : 7,508,700 B2 Page 1 of 1
APPLICATION NO. : 11/724435
DATED : March 24, 2009
INVENTOR(S) : Tom Zhong et al.

It is certified that error appears in the above-identified patent and that said Letters Patent is hereby corrected as shown below:

Title page, Assignees, item (73), delete Assignee, "Magic Technologies, Inc., Milpitas, CA (US)" and replace with -- MagIC Technologies, Inc., Milpitas, CA (US) --.

Signed and Sealed this

Ninth Day of June, 2009

JOHN DOLL
*Acting Director of the United States Patent and Trademark Office*